United States Patent
Aggus et al.

(10) Patent No.: US 6,191,953 B1
(45) Date of Patent: Feb. 20, 2001

(54) CIRCUIT CARD MOUNTING STRUCTURE

(75) Inventors: Trevor J. Aggus, Lincroft; Matthew J. Gawron, Jackson, both of NJ (US)

(73) Assignee: Avaya Technology Corp., Miami Lakes, FL (US)

( * ) Notice: Under 35 U.S.C. 154(b), the term of this patent shall be extended for 0 days.

(21) Appl. No.: 09/473,769

(22) Filed: Dec. 29, 1999

(51) Int. Cl.⁷ .................................................... H05K 7/14
(52) U.S. Cl. .......................... 361/796; 361/752; 361/753; 361/788; 361/801; 361/810; 3174/52.1
(58) Field of Search .................................... 361/724–726, 361/736, 752, 753, 759, 788, 796, 801, 807, 809–810, 816, 818; 174/35 R, 52.1

(56) References Cited

U.S. PATENT DOCUMENTS

| | | | | |
|---|---|---|---|---|
| 5,138,529 | * | 8/1992 | Colton et al. ......................... | 361/424 |
| 5,400,214 | * | 3/1995 | Antonnucio et al. ................. | 361/683 |
| 5,519,585 | * | 5/1996 | Jones et al. ........................... | 361/818 |
| 5,590,023 | * | 12/1996 | Hernandez et al. .................. | 361/683 |
| 5,691,504 | * | 11/1997 | Sands et al. .......................... | 174/35 R |
| 5,801,928 | * | 9/1998 | Burstedt et al. ...................... | 361/801 |
| 5,999,416 | * | 12/1999 | McAnally et al. .................... | 361/816 |

\* cited by examiner

Primary Examiner—Jeffrey Gaffin
Assistant Examiner—Tuan Dinh
(74) Attorney, Agent, or Firm—David L. Davis

(57) ABSTRACT

Structure for mounting a circuit card to a sheet metal wall includes upper and lower standoffs formed integrally with the wall. Each upper standoff extends a predetermined distance from the wall and is adapted to receive and hold a fastening member. Each lower standoff is formed integrally with the wall and includes a projection portion extending the same predetermined distance away from the wall and a hook portion having a support portion extending away from the projecting portion and a securement portion extending upwardly from the support portion and spaced from the projecting portion by a distance equal substantially to the thickness of the circuit card. Accordingly, a lower edge of the circuit card is supported by each lower standoff hook portion and fastening members are extended through holes in the circuit card to threadedly engage the upper standoffs.

4 Claims, 4 Drawing Sheets

CIRCUIT CARD MOUNTING STRUCTURE

BACKGROUND OF THE INVENTION

This invention relates to circuit card enclosures and, more particularly, to improved structure for mounting a circuit card to a back wall of such an enclosure.

Complex electronic systems typically include a rectilinear sheet metal enclosure for the circuit cards making up the electronic system. Usually, a backplane board (i.e., a particular form of circuit card) is supported along a back wall of the enclosure and card guides are provided on the top and bottom walls of the enclosure so that the circuit cards making up the electronic system can be slid into the enclosure for mating engagement with connectors provided on the backplane board. Conventionally, the circuit card enclosure is formed of sheet metal and standoffs formed directly on the back wall of the enclosure are used for mounting the backplane thereto. These standoffs typically require screws extending through appropriately located openings in the backplane board to secure the backplane board to the back wall. Such screws add parts cost to the system and sometimes add assembly costs because they can be difficult to secure because of obstructions or inconvenient standoff location in the enclosure. For example, when the backplane board is located relatively low along the back wall of the enclosure, it is often difficult to have sufficient clearance for a screwdriver. It would therefore be desirable to provide circuit card mounting structure which eliminates screws to reduce part and assembly costs and also simplifies the assembly, further reducing assembly costs.

SUMMARY OF THE INVENTION

According to the present invention, there is provided mounting structure for mounting a circuit card parallel to a sheet metal wall. The inventive structure includes at least one lower standoff formed integrally from the wall. Each lower standoff includes a projecting portion extending a predetermined distance away from the wall, and a hook portion. The hook portion has a support portion extending away from the projecting portion and a securement portion extending upwardly from the support portion and spaced from the projecting portion by a distance equal substantially to the thickness of the circuit card. The mounting structure also includes at least one upper standoff formed integrally from the wall. Each upper standoff extends the predetermined distance from the wall and is adapted to receive and hold a fastening member. Accordingly, a lower edge of the circuit card is supported by each lower standoff hook portion and a fastening member is utilized to secure the circuit card to each upper standoff.

In accordance with an aspect of this invention, there are a plurality of lower standoffs arrayed on the wall with the support portions of the plurality of lower standoffs all lying along a predetermined straight line.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
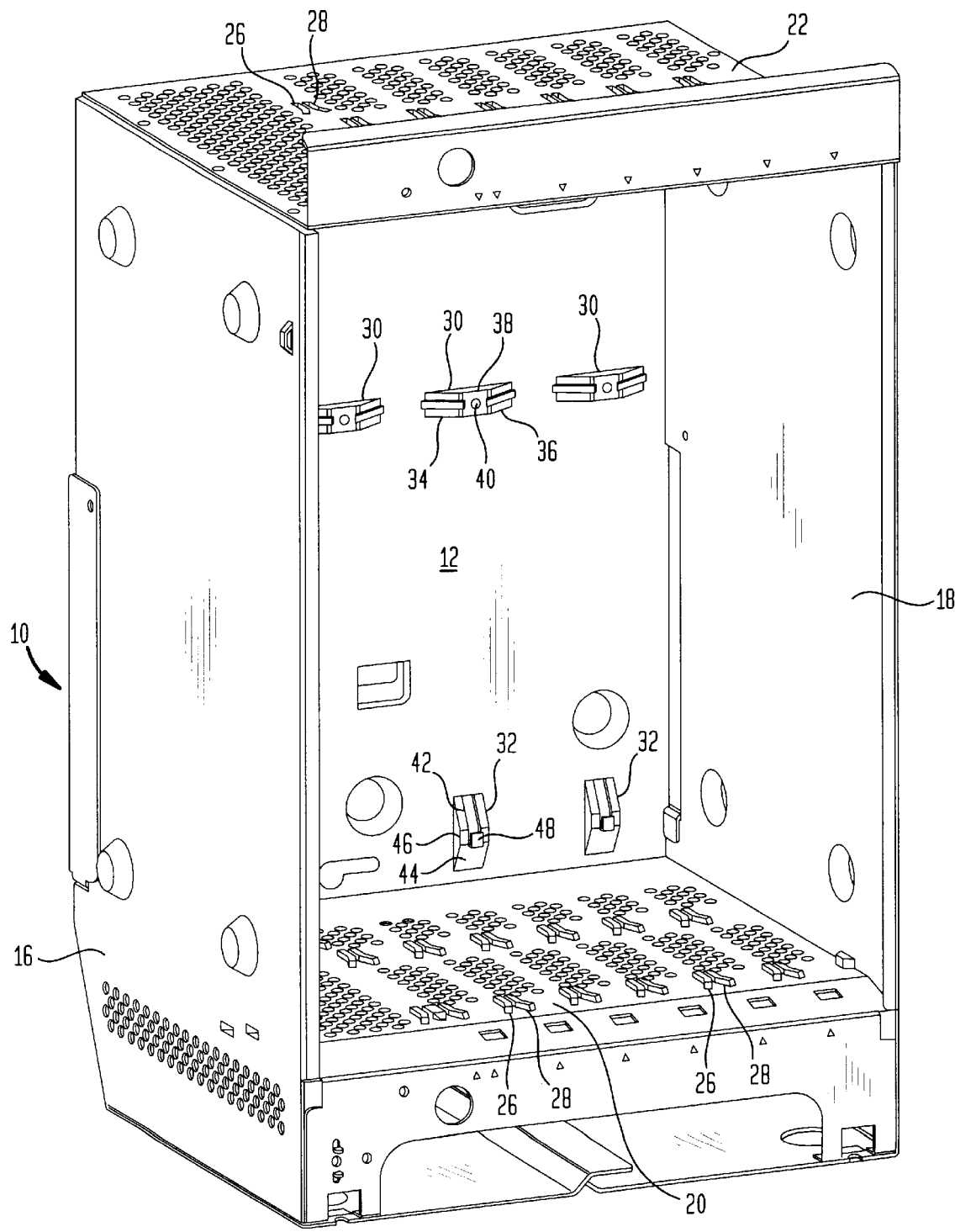
FIG. 1 is a perspective view of a circuit card enclosure having mounting structure on its back wall constructed according to the present invention.
Figure 2:
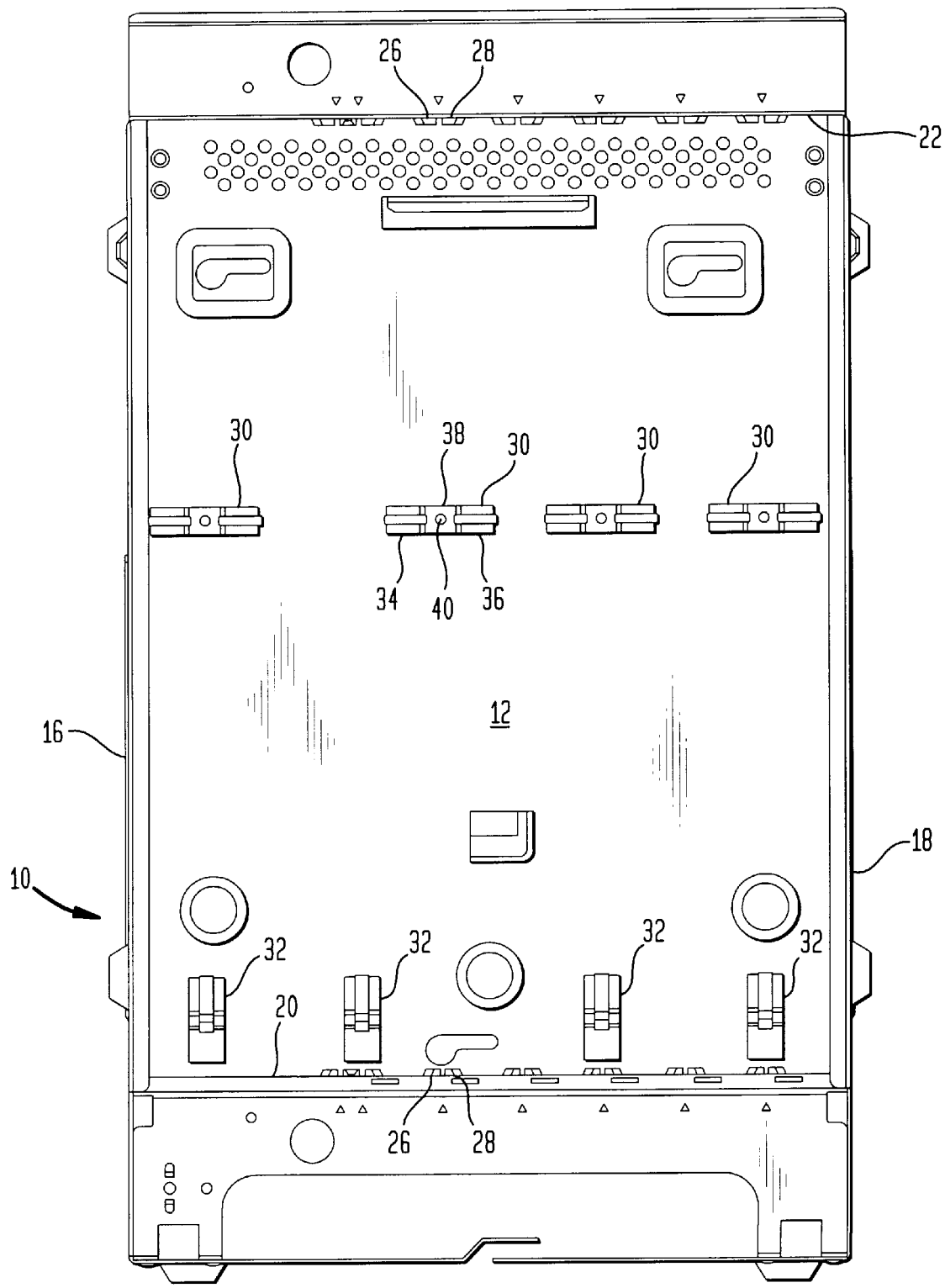
FIG. 2 is a front elevational view of the enclosure shown in FIG. 1.

The drawings show a rectilinear enclosure, designated generally by the reference numeral 10, for holding circuit cards. The enclosure 10 includes a rectilinear sheet metal back wall 12 constructed according to the present invention and having mounting structure adapted to hold a backplane board 14 (FIGS. 3 and 4) parallel to the wall 12. The enclosure 10 further includes a parallel pair of rectangular sheet metal side walls 16, 18 which extend perpendicular to the back wall 12 and forwardly from the back wall 12. Each of the side walls 16, 18 is secured to a respective one of the side edges of the back wall 12. The enclosure 10 also includes a rectangular sheet metal bottom wall 20 which extends perpendicular to and forwardly from the back wall 12. The bottom wall 20 is secured to the lower edge of the back wall 12 and is also secured along each of its opposed lateral edges to a respective one of the pair of side walls 16, 18. Still further, the enclosure 10 includes a rectangular sheet metal top wall 22 which extends perpendicular to and forwardly from the back wall 12. The top wall 22 is secured to the upper edge of the back wall 12 and is secured along each of its opposed lateral edges to a respective one of the pair of side walls 16, 18. Thus, a rectilinear box-like structure is provided for the enclosure 10.

Card guides are provided in the bottom wall 20 and the top wall 22 so that circuit cards (not shown) can be slid into the enclosure 10 for engagement with connectors 24 on the backplane board 14, as is conventional in the art. Illustratively, each card guide is formed by a pair of opposed dogleg-shaped lanced projections 26, 28 which extend inwardly of the enclosure 10 from its respective wall 20, 22. Thus, each of the card guides is formed from the opposed pair of dogleg-shaped projections 26, 28 as a Y-shaped slot. The projections 26, 28 forming the card guides are spaced on the walls 20, 22 so that the circuit cards are held parallel to the side walls 16, 18.

In order to mount the backplane board 14 parallel to the back wall 12, according to the present invention there are fabricated integrally with the back wall 12, by a "lance and form" technique, a plurality of upper standoffs 30 and a plurality of lower standoffs 32. Each of the upper standoffs 30 includes a pair of sides 34, 36 which are angled away from the back wall 24 and toward each other and are joined by a flat crown 38 which is parallel to the back wall 12 and is spaced a predetermined distance from the back wall 12. Each of the crowns 38 is formed with a central opening 40 adapted to threadingly receive a screw.

Each of the lower standoffs 32 has a projecting portion including a pair of sides 42, 44 which are angled away from the back wall 12 and toward each other and are joined by a flat crown 46 which is parallel to the back wall 12 and is spaced from the back wall 12 by the same predetermined distance as each crown 38 is spaced from the back wall 12. In addition, each lower standoff 32 includes a hook portion 48 having a support portion 50 extending away from the crown 46, and a securement portion 52 extending upwardly from the distal end of the support portion 50 and spaced from the crown 46 by a distance equal substantially to the thickness of the backplane board 14. The lower standoffs 32 are positioned on the back wall 12 so that their support portions 50 all lie along a predetermined straight line.

Figure 3:
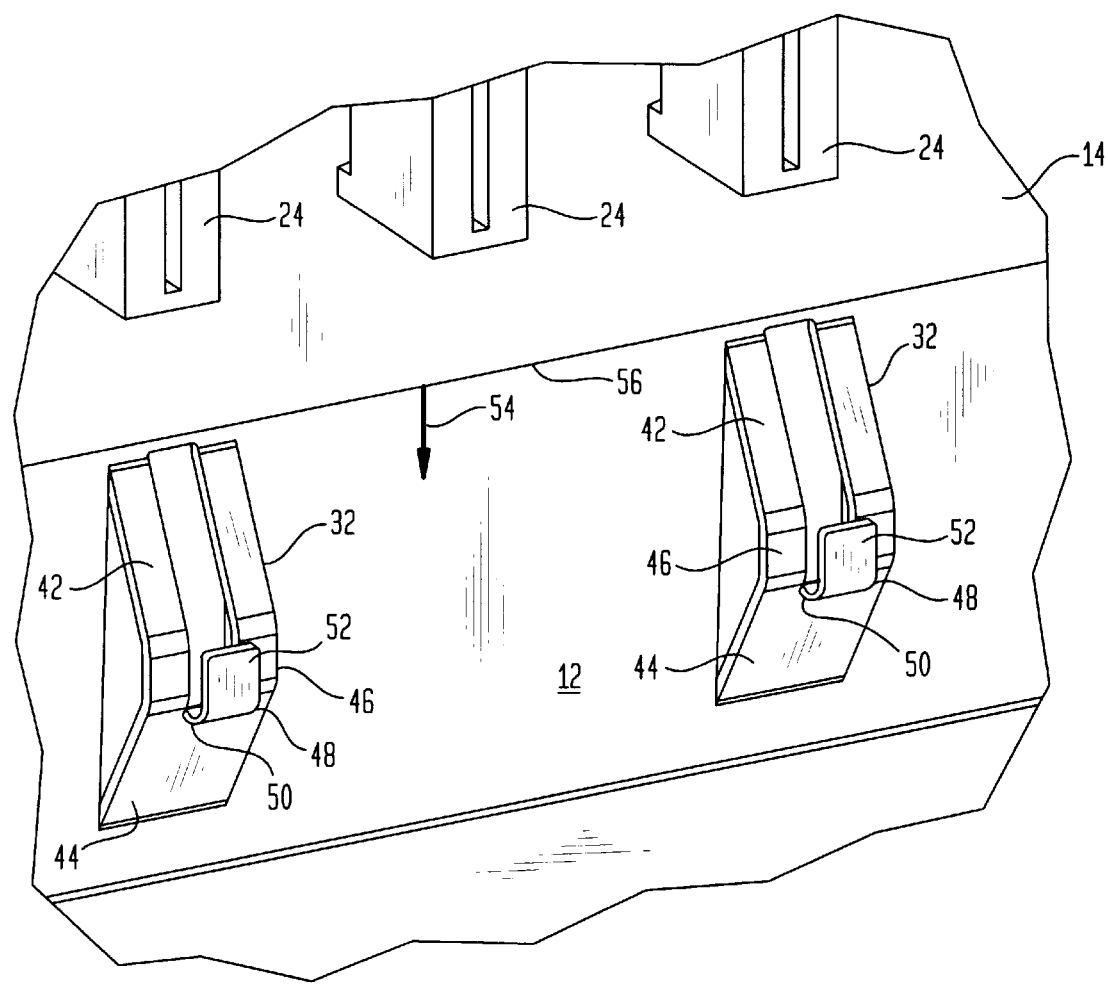
FIG. 3 is an enlarged perspective view showing a circuit card being moved for engagement with the lower standoffs of the inventive mounting structure.
Figure 4:
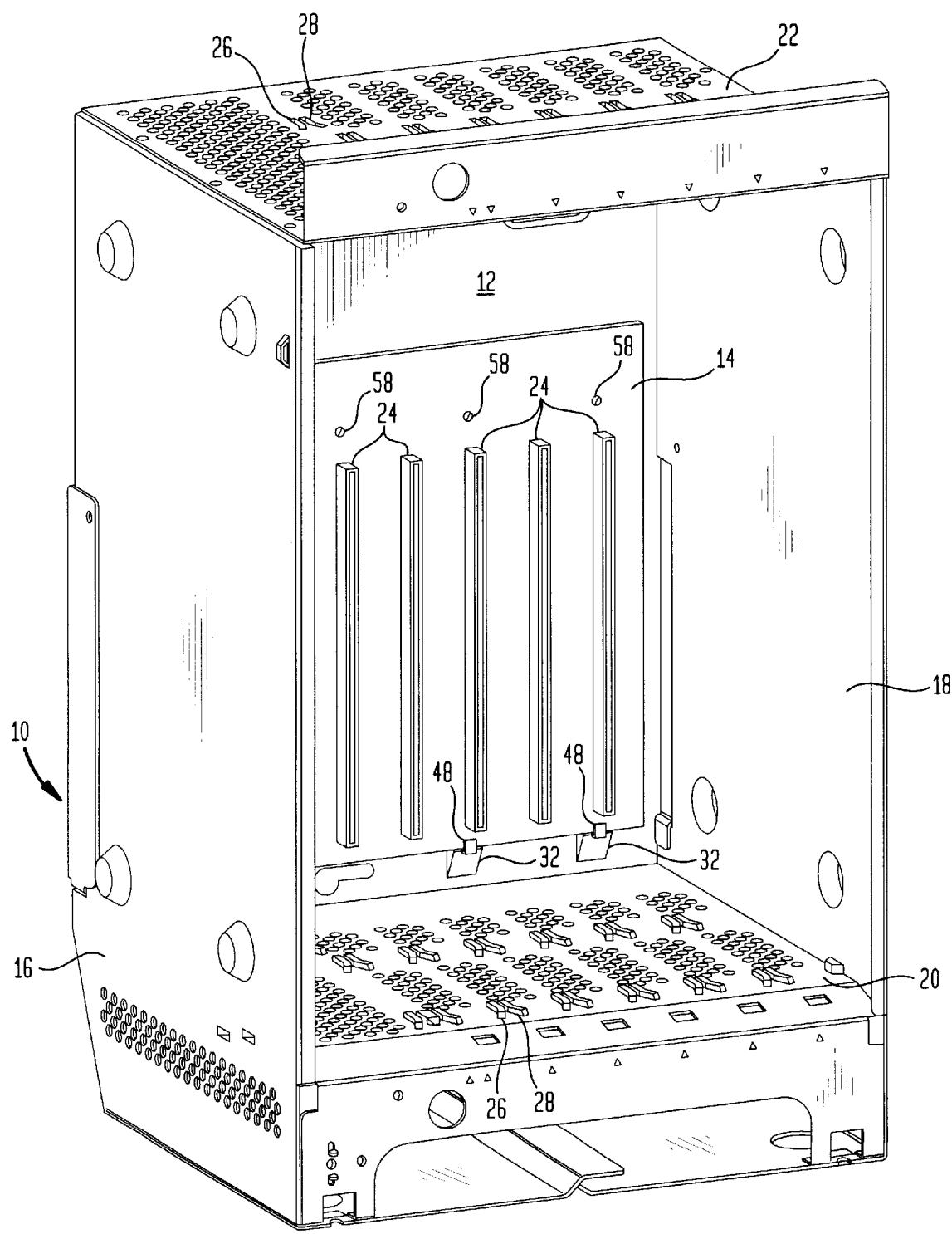
FIG. 4 is a perspective view, similar to FIG. 1, showing a circuit card mounted to the back wall of the enclosure by mounting structure constructed according to the present invention.

To assemble the backplane board 14 to the enclosure 10, the backplane board 14 is placed within the enclosure 10 and is moved downwardly, as indicated by the arrow 54 in FIG. 3, so that the backplane board 14 is located between the crown 46 and the securement portion 52 of all of the lower standoffs 32, with the lower edge 56 of the backplane board 14 engaging the support portions 50 of all of the lower standoffs 32. The backplane board 14 is formed with through-holes remote from the lower edge 56, and the backplane board 14 is moved horizontally until those holes are each in registration with a respective opening 40 in an upper standoff 30. Screws 58 (FIG. 4) are then inserted through those holes and threaded into the openings 40 to secure the backplane board 14 to the back wall 12.

Thus, according to the present invention, the cost of assembly is reduced because no screws are required to hold the lower end of the backplane board 14. In addition to the reduction in piece parts, the assembly itself is made easier because the backplane board 14 is automatically aligned in the vertical direction by the hook portions 48 and it only needs to be moved horizontally to be fully aligned for inserting the screws 58 in the upper standoffs 30. In addition to automatically aligning the backplane board 14 vertically, the hook portions 48 hold the backplane board 14 in place against forces generated during the insertion/removal of circuit cards.

Accordingly, there has been disclosed improved structure for mounting a circuit card to a back wall of a circuit card enclosure. While an illustrative embodiment of the present invention has been disclosed herein, it is understood that various adaptations and modifications to the disclosed embodiment are possible and it is intended that this invention be limited only by the scope of the appended claims.

What is claimed is:

1. Mounting structure for mounting a circuit card parallel to a sheet metal wall, the structure comprising:
   at least one lower standoff formed integrally from said wall, each of said at least one lower standoff including:
      a projecting portion extending a predetermined distance away from said wall; and
      a hook portion having a support portion extending away from said projecting portion and a securement portion extending upwardly from said support portion and spaced from said projecting portion by a distance equal substantially to the thickness of said circuit card; and
   at least one upper standoff formed integrally from said wall, each of said at least one upper standoff extending said predetermined distance from said wall and adapted to receive and hold a fastening member;
   whereby a lower edge of said circuit card is supported by each lower standoff hook portion and a fastening member is utilized to secure said circuit card to each upper standoff.

2. The mounting structure according to claim 1 wherein there are a plurality of lower standoffs arrayed on said wall with the support portions of said plurality of lower standoffs all lying along a predetermined straight line.

3. The mounting structure according to claim 1 wherein said projecting portion includes a pair of sides which are angled away from said wall and toward each other and a flat crown parallel to said wall and joining said sides, said crown being spaced said predetermined distance from said wall.

4. The mounting structure according to claim 1 wherein each of said at least one upper standoff includes a pair of sides which are angled away from said wall and toward each other and a flat crown parallel to said wall and joining said sides, said crown being spaced said predetermined distance from said wall, said crown being formed with an opening adapted to threadingly receive a screw.

* * * * *